United States Patent
Bell et al.

(10) Patent No.: US 9,859,913 B2
(45) Date of Patent: Jan. 2, 2018

(54) CALIBRATION OF RAMP DIGITAL TO ANALOG CONVERTER

(71) Applicant: Synaptics Incorporated, San Jose, CA (US)

(72) Inventors: Marshall Bell, Austin, TX (US); Stephen Morein, San Jose, CA (US); Imre Knausz, Fairport, NY (US)

(73) Assignee: Synaptics Incorporated, San Jose, CA (US)

(*) Notice: Subject to any disclaimer, the term of this patent is extended or adjusted under 35 U.S.C. 154(b) by 90 days.

(21) Appl. No.: 14/871,980

(22) Filed: Sep. 30, 2015

(65) Prior Publication Data
US 2017/0093421 A1    Mar. 30, 2017

(51) Int. Cl.
*H03M 1/00* (2006.01)
*H03M 1/66* (2006.01)
*H03M 1/10* (2006.01)
*G09G 5/18* (2006.01)

(52) U.S. Cl.
CPC ............... *H03M 1/66* (2013.01); *G09G 5/18* (2013.01); *H03M 1/1014* (2013.01); *G09G 2310/027* (2013.01); *G09G 2320/0693* (2013.01); *G09G 2330/12* (2013.01)

(58) Field of Classification Search
CPC .. H03M 1/742; H03M 1/1009; H03M 1/1033; H03M 1/1057; H03M 1/1061; H03M 1/66; H03M 1/1019; H03M 1/68
USPC .......................... 341/118–121, 135, 136, 144
See application file for complete search history.

(56) References Cited

U.S. PATENT DOCUMENTS

| 5,920,273 A * | 7/1999 | Hirano | H03M 3/384 341/118 |
|---|---|---|---|
| 6,556,155 B1 * | 4/2003 | Wiles, Jr. | H03F 3/087 341/119 |
| 8,743,087 B2 | 6/2014 | Hotelling et al. | |
| 2005/0035957 A1 * | 2/2005 | Lin | G09G 5/006 345/204 |
| 2007/0210946 A1 * | 9/2007 | Hsieh | H03M 1/1057 341/120 |
| 2008/0238327 A1 * | 10/2008 | Cho | G09G 3/3241 315/169.3 |
| 2010/0079320 A1 * | 4/2010 | Wang | H03M 1/1033 341/120 |
| 2011/0137604 A1 * | 6/2011 | Dasnurkar | H03M 1/109 702/117 |
| 2013/0049863 A1 * | 2/2013 | Chiu | H03F 3/45183 330/253 |

(Continued)

*Primary Examiner* — Linh Nguyen
(74) *Attorney, Agent, or Firm* — Osha Liang LLP

(57) ABSTRACT

A source driver including: a current source that provides an approximately constant current; a channel coupled to a source electrode and including a digital to analog converters (DAC), the DAC including: a voltage source that applies an output voltage to the source electrode based on the approximately constant current provided by the current source; and a control unit having circuitry that: inputs a digital value; and terminates, based on the digital value, charging of the voltage source by the approximately constant current; and a calibration unit having circuitry that: generates a comparison between a test voltage applied by the voltage source with a target voltage; and modifies the approximately constant current based on the comparison.

16 Claims, 20 Drawing Sheets

(56) References Cited

U.S. PATENT DOCUMENTS

| | | | |
|---|---|---|---|
| 2014/0240152 A1* | 8/2014 | Song | H03M 1/1061 341/120 |
| 2014/0329339 A1* | 11/2014 | Chaji | G01R 31/26 438/10 |
| 2015/0035813 A1* | 2/2015 | Lei | G09G 3/3208 345/205 |
| 2015/0349793 A1* | 12/2015 | Saripalli | H03M 1/1019 341/120 |

* cited by examiner

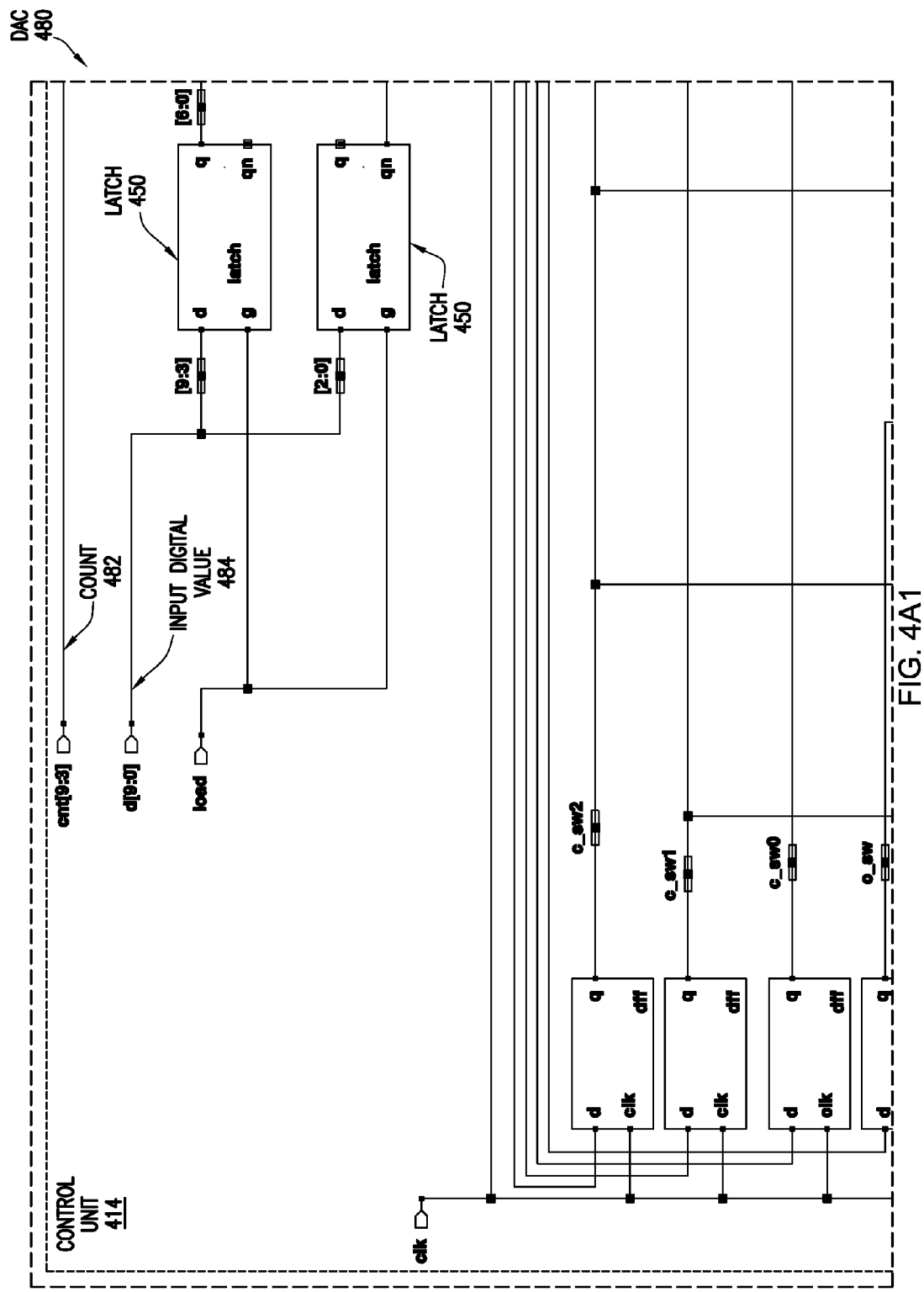
FIG. 4A1

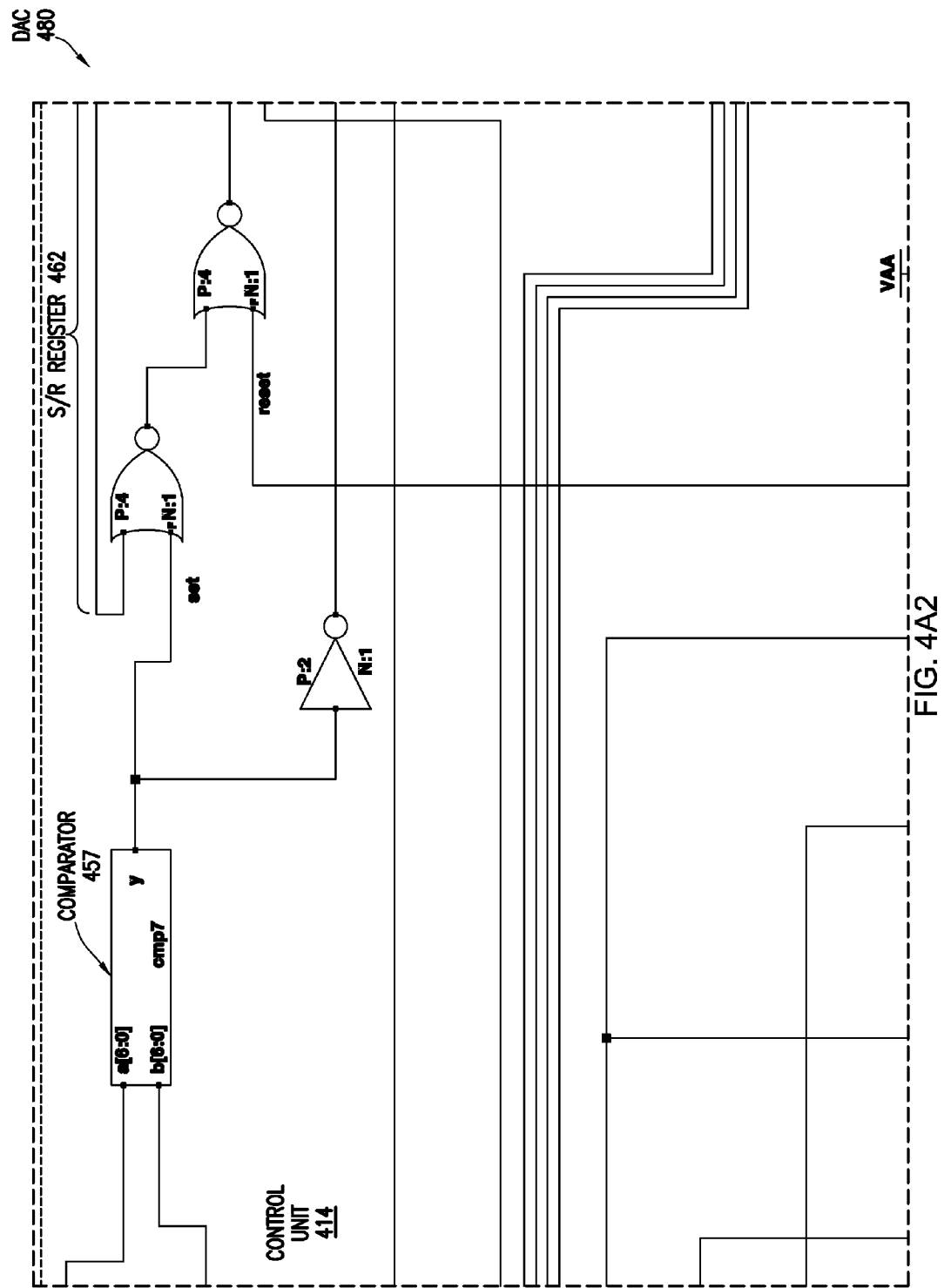
FIG. 4A2

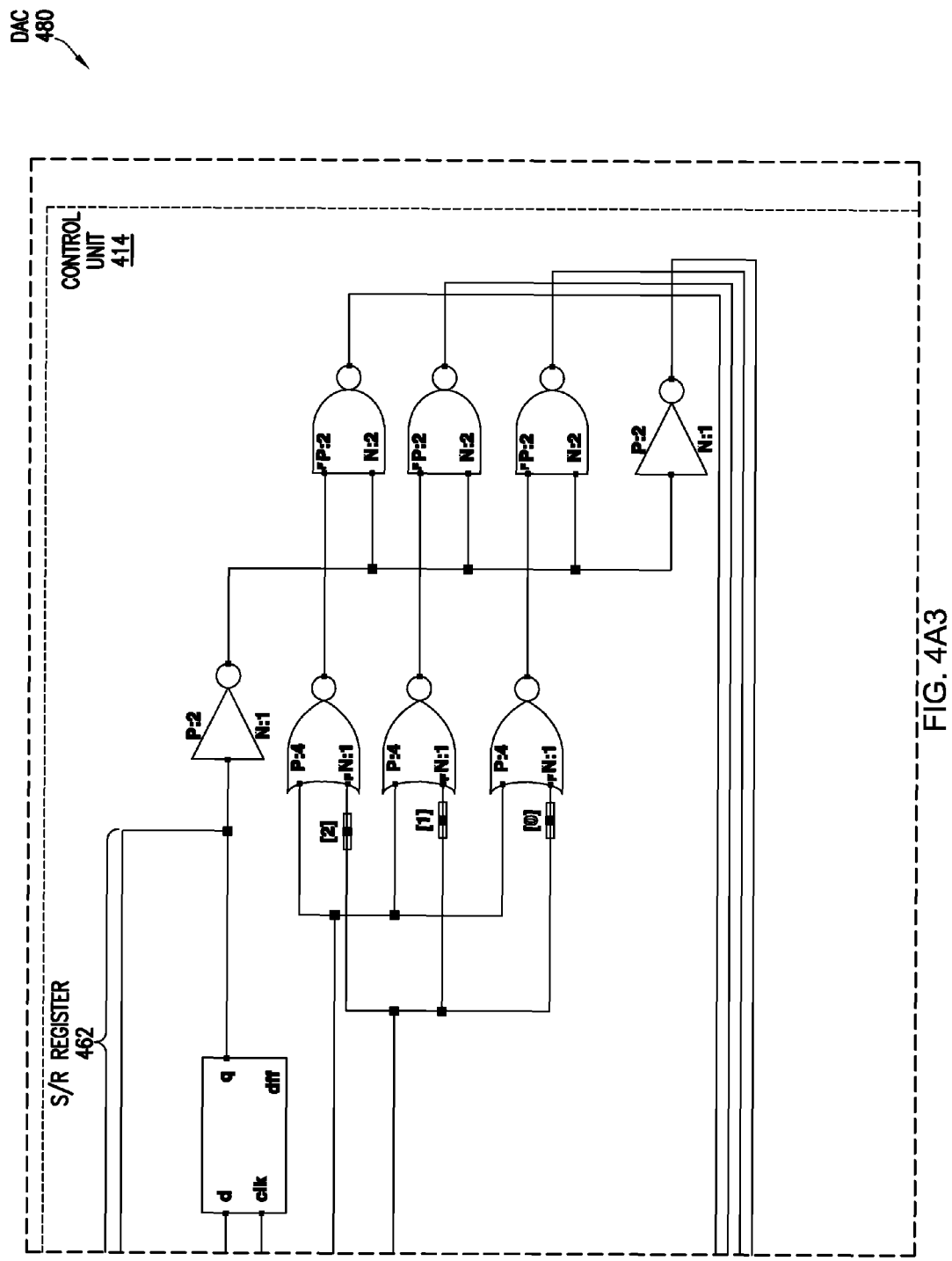
FIG. 4A3

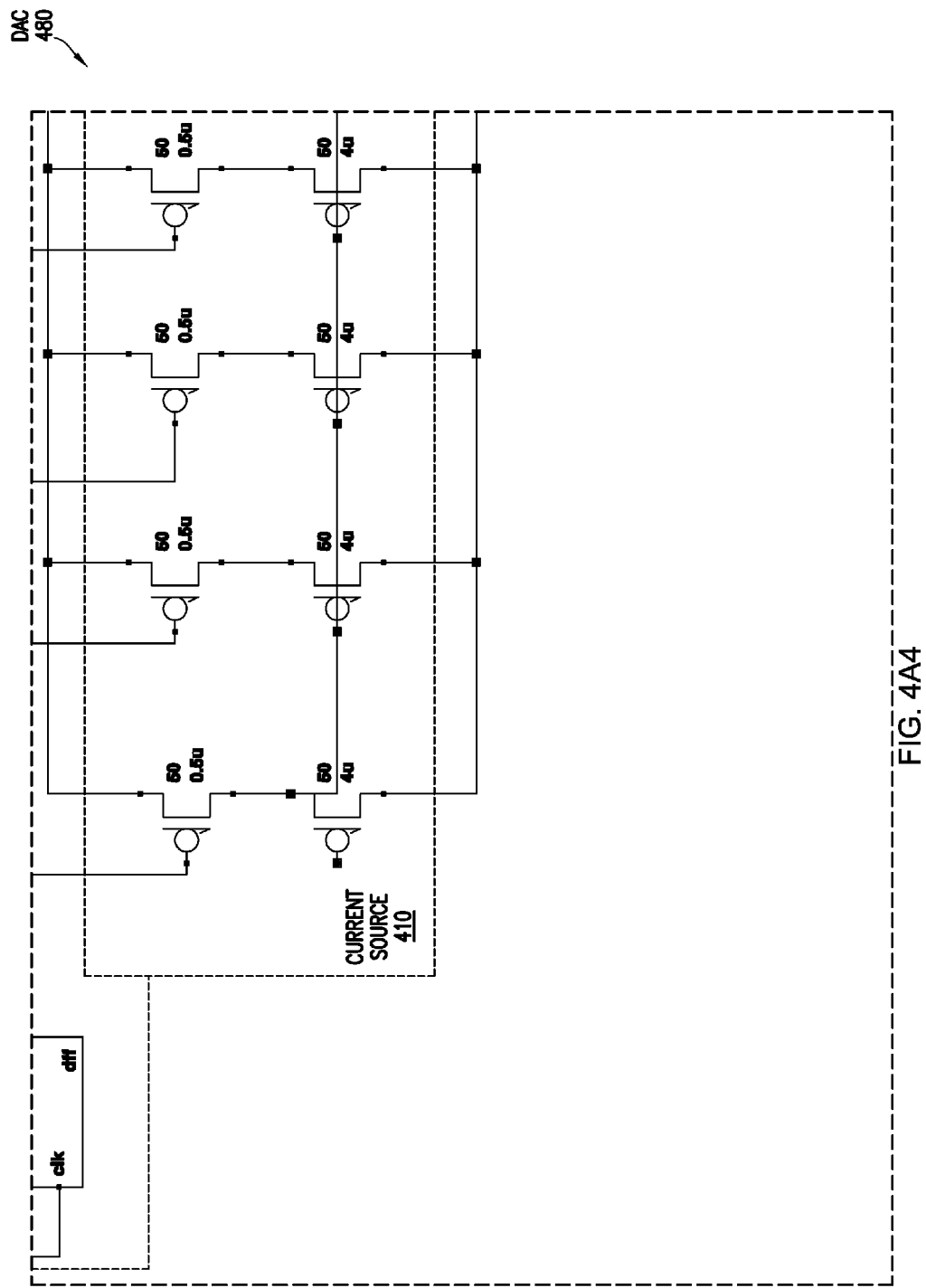
FIG. 4A4

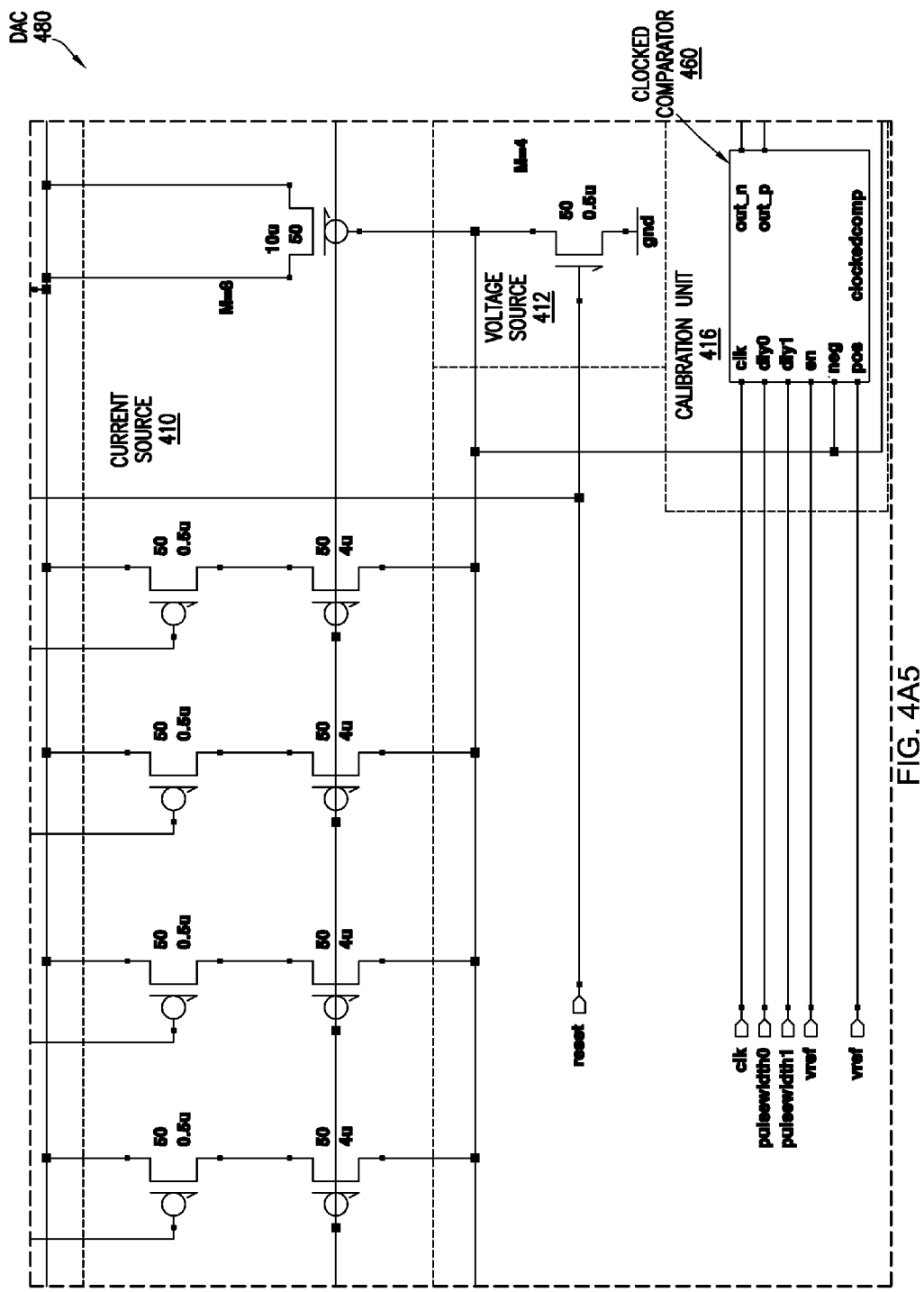
FIG. 4A5

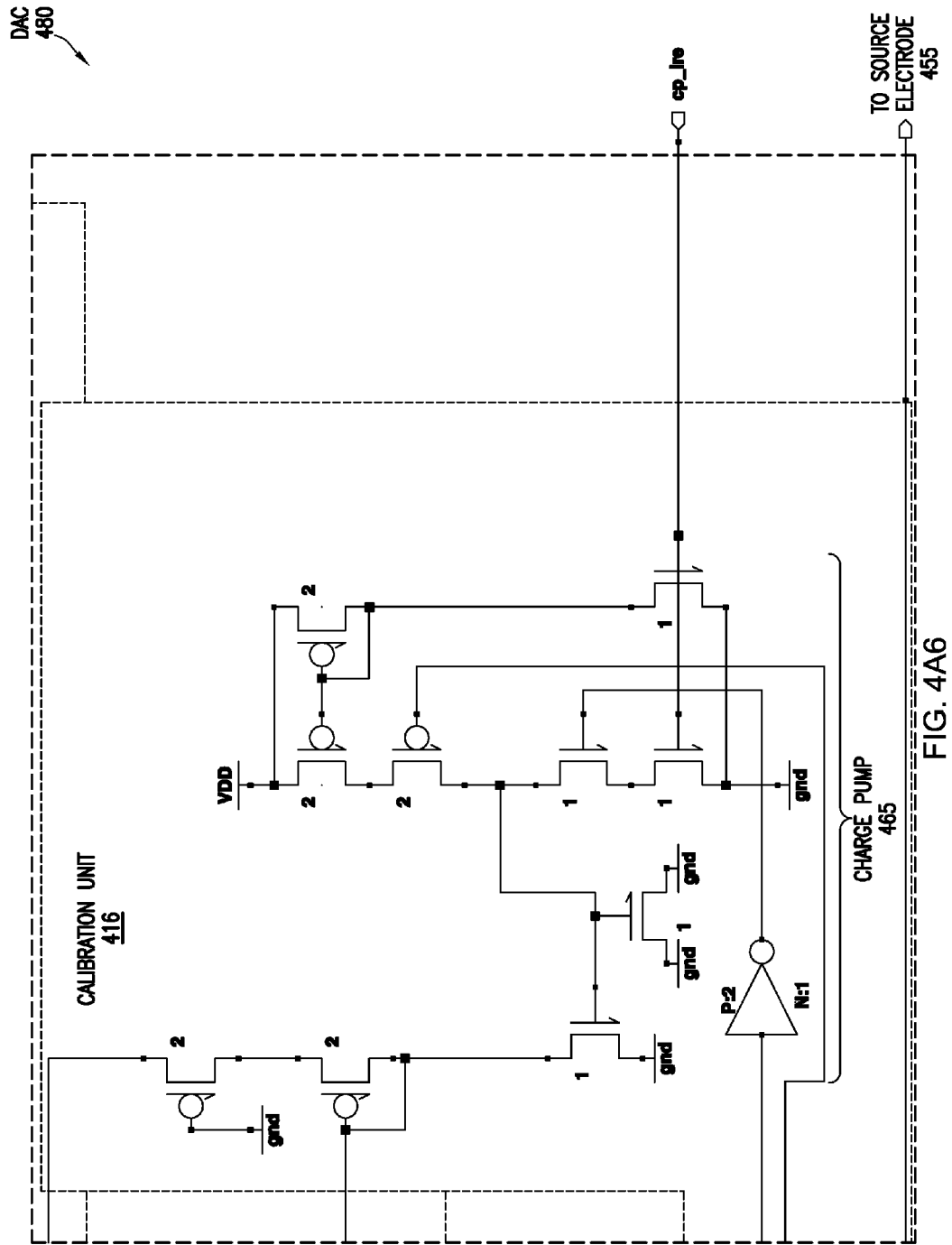
FIG. 4A6

CALIBRATION OF RAMP DIGITAL TO ANALOG CONVERTER

FIELD

This invention generally relates to electronic devices.

BACKGROUND

Digital to analog converters (DACs) are widely used in a variety of electronic systems. A DAC converts a digital input into an analog signal (e.g., voltage, current, etc.). The analog signal may be used to drive, for example, loudspeakers, display screens, etc. The suitability of a DAC architecture for a particular application is determined by several parameters including physical size, power consumption, resolution, speed, accuracy, and cost. The parameters of physical size and power consumption are especially important when many DACs are required in a device that has a constrained size and power supply (e.g., cellular phones, tablet personal computers (PCs), or any other mobile device).

SUMMARY

In general, in one aspect, one or more embodiments of the invention relate to a source driver for a display. The source driver comprises: a current source that provides an approximately constant current; a channel coupled to a source electrode and comprising a digital to analog converters (DAC), the DAC comprising: a voltage source that applies an output voltage to the source electrode based on the approximately constant current provided by the current source; and a control unit comprising circuitry that: inputs a digital value; and terminates, based on the digital value, charging of the voltage source by the approximately constant current; and a calibration unit comprising circuitry that: generates a comparison between a test voltage applied by the voltage source with a target voltage; and modifies the approximately constant current based on the comparison.

In general, in one aspect, one or more embodiments of the invention relate to a method for operating a source driver for a display. The method comprises: obtaining, by a digital to analog converter (DAC) in a channel of the source driver, a digital value; charging, using a current source that provides an approximately constant current, a voltage source of the DAC; setting, using the voltage source of the DAC, a source electrode of the channel to an output voltage based on the charging; terminating charging of the voltage source based on the digital value; generating, by a calibration unit, a comparison of a test voltage applied by the voltage source with a target voltage; and modifying, by the calibration unit, the approximately constant current based on the comparison.

In general, in one aspect, one or more embodiments of the invention relate to a digital to analog converter (DAC). The DAC comprises: a current source that provides an approximately constant current; and a voltage source that outputs a voltage based on the approximately constant current provided by the current source; a control unit comprising circuitry that: inputs a digital value; terminates, based on the digital value, charging of the voltage source by the approximately constant current; and a calibration unit comprising circuitry that: generates a comparison between a test voltage applied by the voltage source with a target voltage; and modifies the approximately constant current based on the comparison.

Other aspects of the invention will be apparent from the following description and the appended claims.

BRIEF DESCRIPTION OF DRAWINGS

FIGS. 4A1-4A6 each show a magnified view of a different region of FIG. 4A.

FIG. 6 shows a bias generator in accordance with one or more embodiments.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Various embodiments of the present invention provide source drivers, DACs, and methods for their use in electronic systems such as mobile devices. Various embodiments of the present invention provide a system and method for calibrating DACs.

Figure 1:
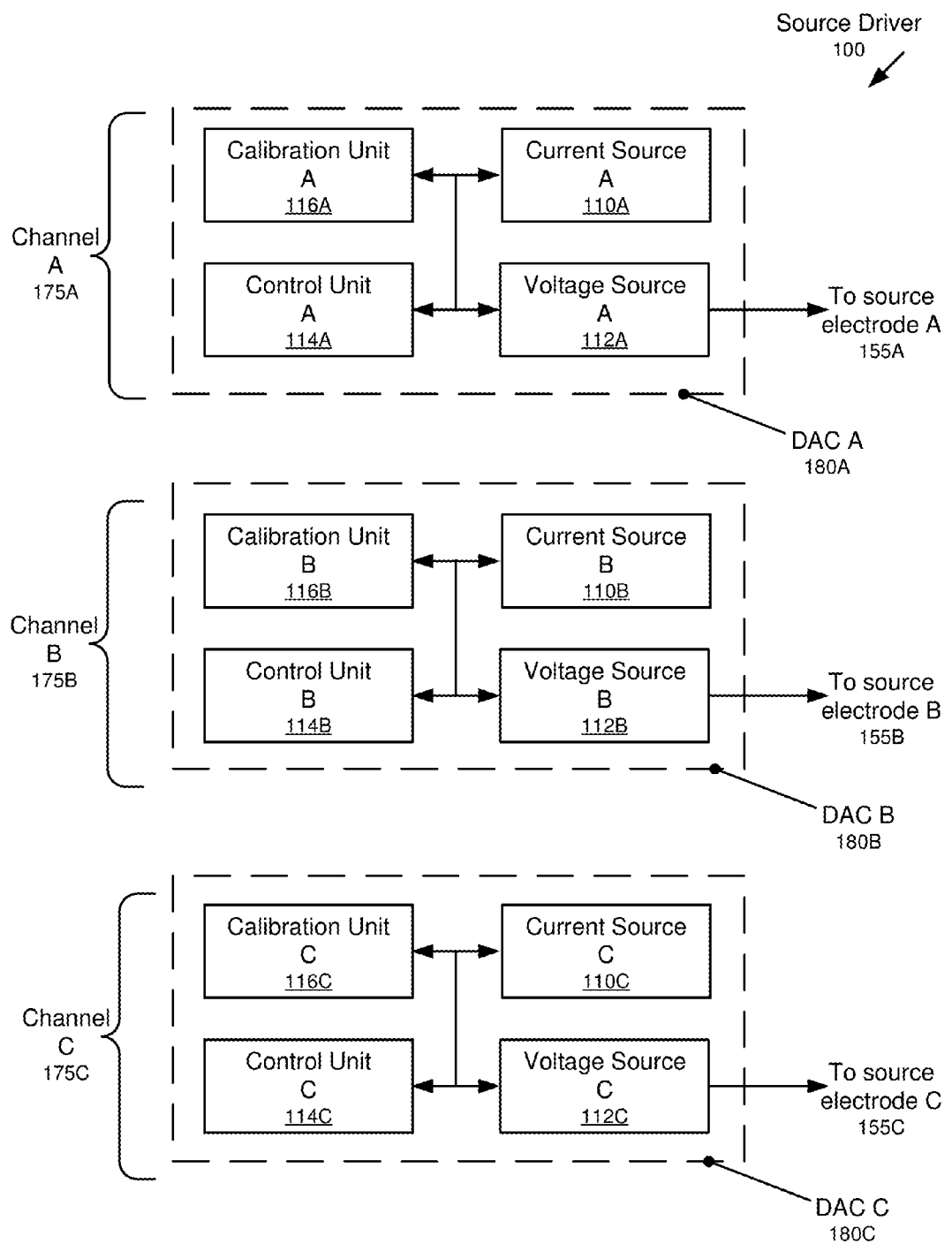
FIG. 1 shows a source driver in accordance with one or more embodiments.

FIG. 1 shows a source driver (100) for a display (e.g., LCD) in accordance with one or more embodiments. As shown in FIG. 1, the source driver (100) has multiple channels: Channel A (175A), Channel B (175B), and Channel C (175C). Although only three channels are shown, the source driver (100) may have any number of channels (e.g., 1000-3000 channels). Each channel includes a DAC. For example, Channel A (175A) has DAC A (180A), Channel B (175B) has DAC B (180B), and Channel C (175C) has DAC C (180C). The multiple DACs (180A, 180B, 180C) input digital values (not shown) and output voltages that are applied to source electrodes (e.g., Source Electrode A (155A), Source Electrode B (155B), Source Electrode C (155C)) in the display. Specifically, the channels (175A, 175B, 175C) may drive rows or columns of pixels in the display (e.g., LCD) based on the input digital values.

In one or more embodiments, each DAC (180A, 180B, 180C) includes a current source (e.g., Current Source A (110A), Current Source B (110B), Current Source C (110C)). Each current source (110A, 110B, 110C) may include one or more mirrored currents. Two mirrored currents within a single current source (110A, 110B, 110C) may be of different amperages. The current sources and mirrored currents provide approximately constant currents. Although FIG. 1 shows each DAC (180A, 180B, 180C) as having its own current source, in one or more embodiments, a current source may be shared by multiple DACs.

In one or more embodiments, each DAC (180A, 180B, 180C) includes a voltage source (i.e., Voltage Source A (112A), Voltage Source B (112B), Voltage Source C (112C)). Each voltage source (112A, 112B, 112C) applies a voltage to a source electrode (155A, 155B, 155C). Each voltage source (112A, 112B, 112C) is charged by the current provided by a current source (110A, 110B, 110C). Continuously or repeatedly charging the voltage source (112A, 112B, 112C) effectively increases (i.e., ramps) the voltage applied by the voltage source (112A, 112B, 112C). In one or more embodiments, the voltage source (112A, 112B, 112C) is an integrator (e.g., a MOS capacitor). The voltage source (112A, 112B, 112C) may reset to zero or any non-zero reset voltage at any time (e.g., start of a display line update time).

In one or more embodiments, each DAC (180A, 180B, 180C) includes a control unit (i.e., Control Unit A (114A), Control Unit B (114B), Control Unit C (114C)). The control unit (114A, 114B, 114B) may be implemented using hardware (i.e., circuitry), software, firmware, or any combination thereof. The control unit (114A, 114B, 114C) controls the charging of the voltage source (112A, 112B, 112C) by the current source (110A, 110B, 110C). Specifically, the control unit (114A, 114B, 114C) may control the duration (e.g., in clock cycles) of the charging based on the input digital value. Accordingly, the control unit (114A, 114B, 114C) starts and/or terminates charging of the voltage source (112A, 112B, 112C) by the current source (110A, 110B, 110C).

In one or more embodiments, each control unit (114A, 114B, 114C) comprises one or more counters (not shown). The input digital value (or a value based on the input digital value) may be loaded into the counter. The counter may be decremented each clock cycle and charging of the voltage source continues until the counter reaches zero. Additionally and/or alternatively, the counter may start at zero and increment each clock cycle. Charging of the voltage source continues until the counter matches the input digital value (or a value based on the input digital value). Additional implementations of the control unit (114A, 114B, 114C) are discussed below.

As discussed above, one or more of the current sources (110A, 110B, 110C) may have multiple mirrored currents of different amperages that are used to charge the voltage sources (112A, 112B, 112C). By using multiple mirrored currents, the same amount of charge can be delivered in less time and/or using a slower clock rate. In such embodiments, multiple counters may be used to control the multiple mirrored currents. For example, assume current source A (110A) has two mirrored currents to charge voltage source A (112A). The input digital value may be partitioned into a set of most significant bits (MSBs) and a set of least significant bits (LSBs). For example, if the input digital value is 13 bits in size, it may be partitioned into 5 LSBs and 8 MSBs. The 5 LSBs and the 8 MSBs may be loaded into two different counters. The mirrored current controlled by the counter with the 8 MSBs may be 32× (i.e., $2^5$) larger than the mirrored current controlled by the counter with the 5 LSBs.

Those skilled in the art, having the benefit of this detailed description, will appreciate that since the duration of the charging is based on the input digital value, and since the voltage applied to a source electrode is based on the duration of the charging, the voltage applied to the source electrode is based, at least in part, on the input digital value. The voltage applied to the source electrode is a function of the current provided by the current source, the duration of the charging by the current as dictated by the input digital value, and the properties of the voltage source (e.g., capacitance, etc.).

In one or more embodiments, each DAC (180A, 180B, 180C) includes a calibration unit (i.e., Calibration Unit A (116A), Calibration Unit B (116B), Calibration Unit C (116C)). The calibration unit (116A, 116B, 116C) is configured to calibrate the current sources (110A, 110B, 110C) to remove, or at least reduce, the impact of clock drift, capacitor and transistor mismatch, and/or PVT variations. Additional implementations of the calibration unit (116A, 116B, 116C) are discussed below.

Figure 2A:
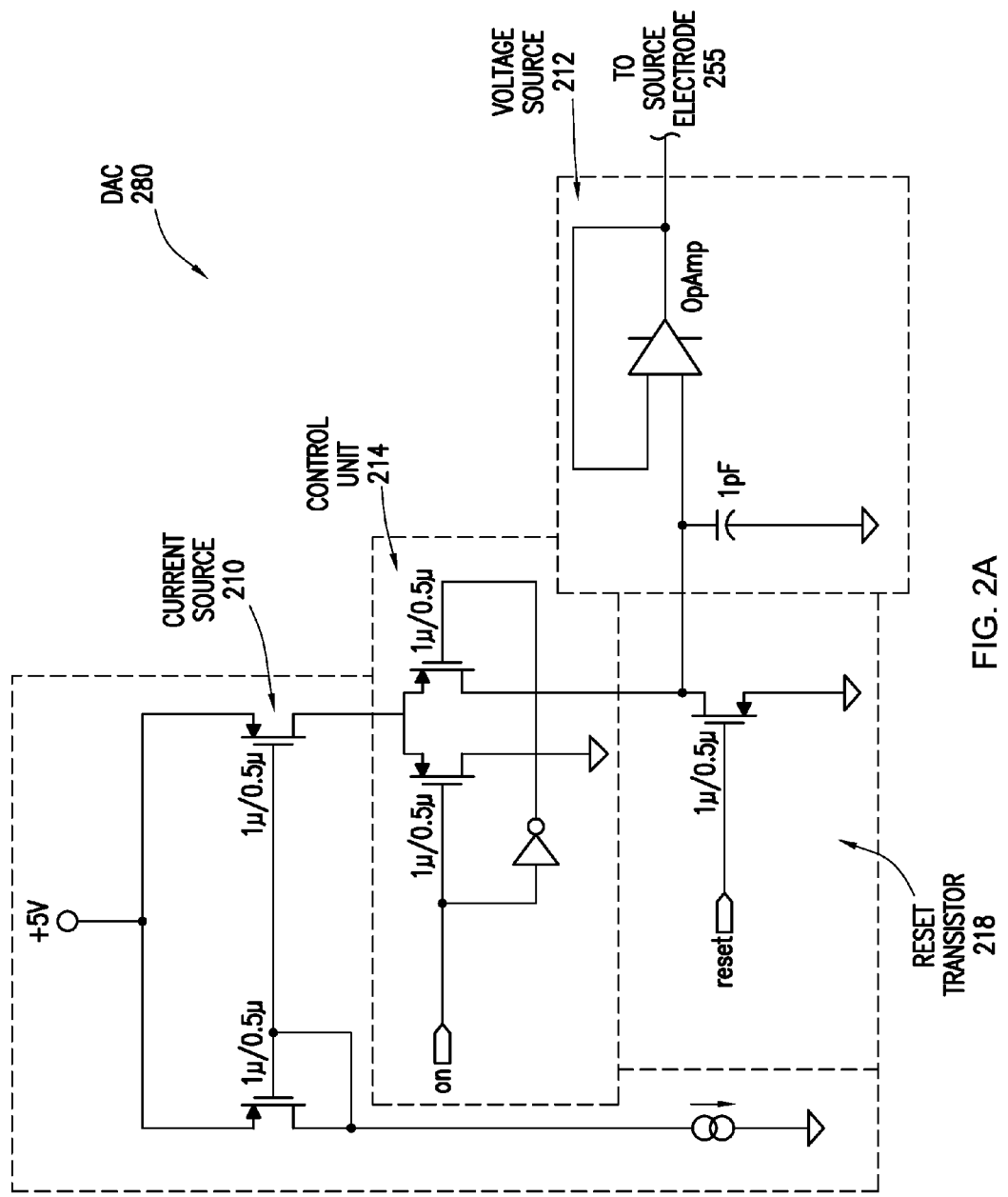
FIG. 2A shows a DAC in accordance with one or more embodiments.

FIG. 2A shows a DAC (280) in accordance with one or more embodiments. The DAC (280) may correspond to any of DAC A (180A), DAC B (180B), and DAC C (180C), discussed above in reference to FIG. 1. The DAC (280) includes a current source (210), a control unit (214), and a voltage source (212).

As shown in FIG. 2A, the voltage source (212) includes a capacitor connected to an operational amplifier (OpAmp) that is wired in a unity gain buffer configuration. The output voltage of the OpAmp is applied to the source electrode (255). Further, the current source (210) includes a mirrored current that provides an approximately constant current to charge the capacitor of the voltage source (212). Further still, the control unit (214) includes a switch. While the switch is selected (i.e., activated, enabled), the current source (210) charges the capacitor. When the switch is not selected (i.e., not activated, disabled), the current provided by the current source (210) is discarded. Selection of the switch and the duration for which the switch is selected is based on the input digital value (not shown). The DAC (280) also includes a reset transistor (218) to reset the capacitor of the voltage source (212) to zero.

Figure 2B:
FIG. 2B shows a timing diagram in accordance with one or more embodiments.

FIG. 2B shows a timing diagram (290) for the DAC (280). As shown in FIG. 2B, at the beginning of the line time, the workline goes active and the capacitor is reset (i.e., using reset transistor (218)). When the switch of the control unit (214) is selected, the current source (210) charges the capacitor in the voltage source (212). Charging continues until the switch is no longer selected. The voltage applied to the source electrode follows the voltage on the capacitor. As discussed above, the voltage on the capacitor is based on the duration of the charging. As also discussed above, the duration of the charging is based on the input digital value. Accordingly, the voltage on the capacitor, and thus the voltage applied to the source electrode (255), is based on the digital input value. Different digital input values will result in different charging durations, and thus different voltages being applied to the source electrode (255).

In one or more embodiments, a second switch may be added to the DAC (280) to turn off the current source (210) completely. In such embodiments, the second switch is turned on several clock cycles ahead of the active current loading time, then turned off at least one clock cycle after the active current loading time. This saves the majority of the current that otherwise would be discarded.

In one or more embodiments, a second switch may be added to the DAC (280) to turn off the OpAmp in the voltage source (212) instead of resetting the capacitor. In such embodiments, the second switch is used if the target voltage for the capacitor is larger than the previous target voltage. By turning off the OpAmp instead of resetting the capacitor, the capacitor only needs to be charged to make up the difference between the previous target voltage and the new, higher, target voltage. In one or more embodiments, if the target voltage is less than the previous target voltage, the capacitor is discharged from the previous target voltage until the new, lower, target voltage is reached, at which time discharging is stopped.

Figure 3:
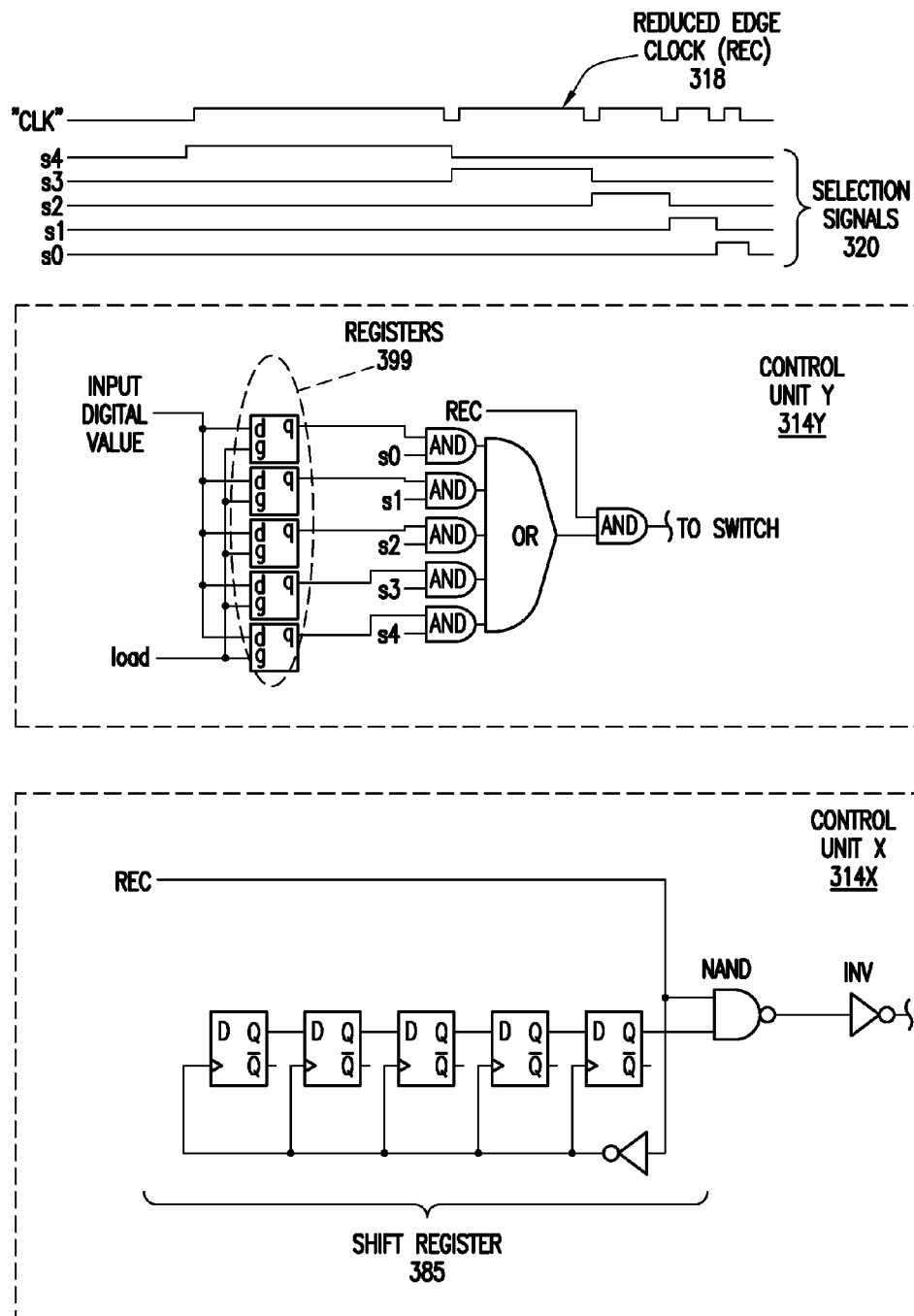
FIG. 3 shows multiple control unit implementations in accordance with one or more embodiments.

FIG. 3 shows multiple control units (i.e., Control Unit Y (314Y), Control Unit X (314X)) in accordance with one or more embodiments. The control units (314Y, 314X) may correspond to one or more of the control units (114A, 114B, 114C) discussed above in reference to FIG. 1 and/or used with the control unit (214) discussed above in reference to FIG. 2A.

In one or more embodiments, the control units (314Y, 315X) utilize a reduced edge clock (REC) (318). The REC (318) is a signal having binary length pulses (e.g., $2^0$, $2^1$, $2^2$, $2^3$, etc.). The REC (318) may be generated from a high speed clock (not shown) and has fewer edges than the high speed clock. The number of pulses and the length of the pulses are a function of the size of the input digital value. Specifically, if the input digital value is N bits in size, the REC (318) is generated with pulses of length $2^0$, $2^1$, $2^2$, $2^3$, ..., $2^{N-2}$, and $2^{N-1}$. For example, as shown in FIG. 3, if the input digital value is 5 bits, the REC (318) has pulses of length $2^0$, $2^1$, $2^2$, $2^3$, and $2^4$. The RCE (318) may be distributed to all control units (114A, 114B, 114C) in the source driver (100).

In one or more embodiments, control unit Y (314Y) utilizes multiple selection signals (320). The number of selection signals (320) is a function of the size of the input digital value. Specifically, if the input digital value is N bits in size, there are N selection signals (S0, S1, S2, ..., SN-2, SN-1). For any given pulse of the REC (318), only one of the N selection signals is high. Moreover, the one selection signal may be high for at least the entire duration of the pulse. The selection signals (320) may be distributed to all control units (114A, 114B, 114C) in the source driver (100).

As shown in FIG. 3, control unit Y (314Y) includes a set of registers (399) and a set of logic gates. Each of the registers (399) is loaded with a bit of the input digital value. This circuit configuration engages the switch (discussed above in reference to control unit (214)), and thus the charging of the voltage source, based on the magnitude of the input digital value. The larger the input digital value, the longer the switch is engaged, the longer the voltage source is charged, and thus the larger the voltage applied by the voltage source to a source electrode.

As also shown in FIG. 3, control unit X (314X) includes a shift register (385) and a set of logic gates. Each of the registers (385) is loaded with a bit of the input digital value. The negative edge (i.e., falling edge) of the REC (318) advances the shift register (385). A high shift out value engages the switch (discussed above in reference to control unit (214)), and thus the charging of the voltage source. In contrast, a low shift out value disengages the switch and thus terminates charging of the voltage source. Similar to control unit Y (314Y), the charging of the voltage source is based on the magnitude of the input digital value. The larger the input digital value, the longer the switch is engaged, the longer the voltage source is charged, and thus the larger the voltage applied by the voltage source to a source electrode.

Those skilled in the art, having the benefit of this detailed description, will appreciate that by distributing the REC (218) instead of the high speed clock having more edges, less power is consumed, a smaller footprint is required, and there is less current integration error resulting from edge jitter.

Figure 4A:
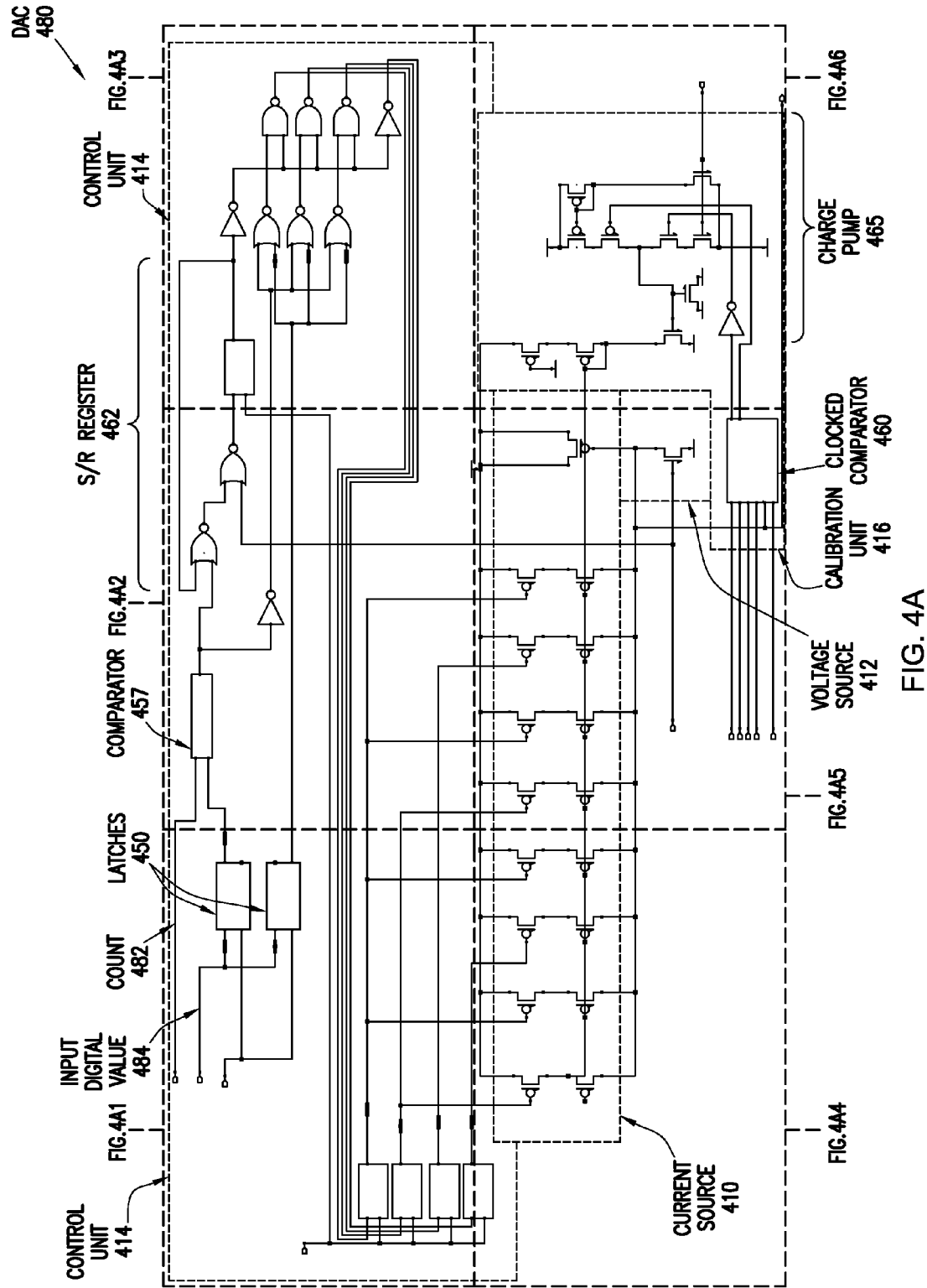
FIG. 4A shows a DAC in accordance with one or more embodiments.
Figure 6:
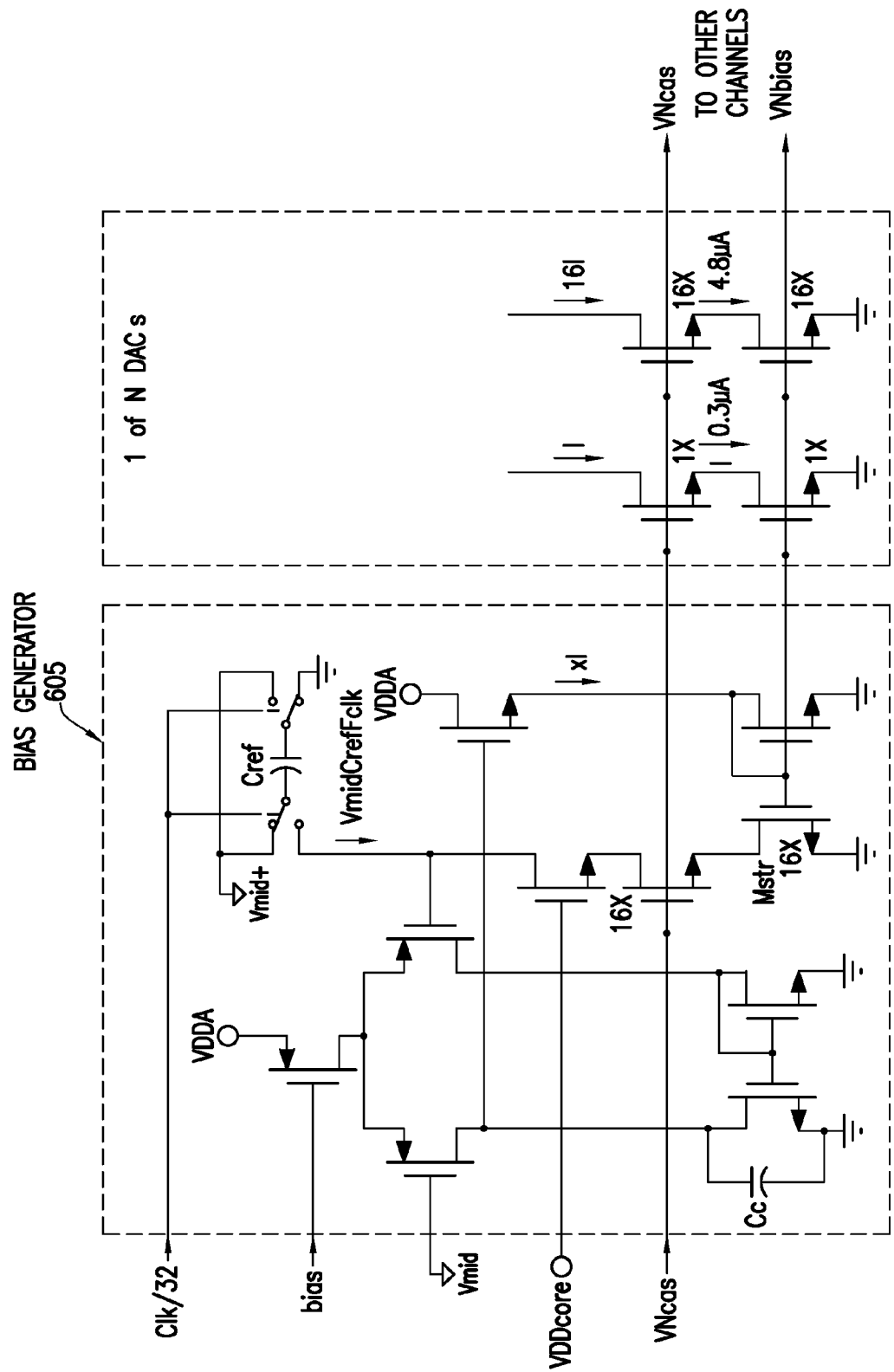

FIG. 4A shows a DAC (480) in accordance with one or more embodiments. FIGS. 4A1-4A6 each show a magnified view of a different region of FIG. 4A. The DAC (480) may correspond to any of DAC A (180A), DAC B (180B), and DAC C (180C), discussed above in reference to FIG. 1. The DAC (480) includes a current source (410), a control unit (414), a voltage source (412), and a calibration unit (416).

In one or more embodiments, the voltage source (412) includes a MOS capacitor. It is this MOS capacitor that is charged and it is the voltage on the MOS capacitor that is applied to the source electrode (455).

In one or more embodiments, the control unit (414) includes one or more latches (450), a comparator (457), and a SR register (462) composed of a D flip-flop and two NOR gates. The input digital value (484) is loaded into the latch (450) and a count (482) is broadcast to all channels. The S/R register (462) is set at the beginning of the count period and cleared when the count (482) equals the input digital value. The output of the S/R register (462) is used to switch on the current source (410) to charge the voltage source (412). Specifically, when the count does not yet equal the input digital value, the output of the S/R register is high and the current source (410) is charging the voltage source (412). However, when the count equals the digital value, the output of the SR register is low, which deactivates the current source (410) and thus terminates the charging of the voltage source (412).

Additionally or alternatively, in one or more embodiments, the input digital value is split into a set of MSBs and a set of LSBs. For example, if the input digital value is 13 bits in size, it may be split into 10 MSBs and 3 LSBs. Further, the current source (410) may be composed of multiple (e.g., eight) mirrored currents. In such embodiments, the MSBs of the input digital value stored in the latch (450) are compared with the MSBs of the count (482) at the beginning of the update period, the voltage source is reset to zero, and the S/R register (462) is reset. Until the MSBs of the count (482) equal the MSBs of the digital input value stored in the latch (450), all eight mirrored currents are enabled. When the MSBs of the count (482) equal the MSBs of the input digital value stored in the latch (450), seven of the eight mirrored current sources are driven by the LSBs (a 3 bit current source parallel DAC). After the SR register (462) is set (by the MSBs equaling), the mirrored currents are all off.

In one or more embodiments, the DAC (480) includes the calibration unit (416). The calibration unit (416) is configured to modify the current provided by the current source (410) using a charge pump (465). Calibration is performed to reduce pvt/transistor mismatch and clock drift. Calibration may occur at any time. For example, the calibration unit (416) may modify the current provided by the current source (410) before each display line update period of a display frame. As another example, the calibration unit (416) may modify the current provided by the current source (410) during vertical blanking periods. As yet another example, the calibration unit may modify (416) the current provided by the current source (410) during non-display update periods that occur between display line update periods of a display frame.

Figure 4B:
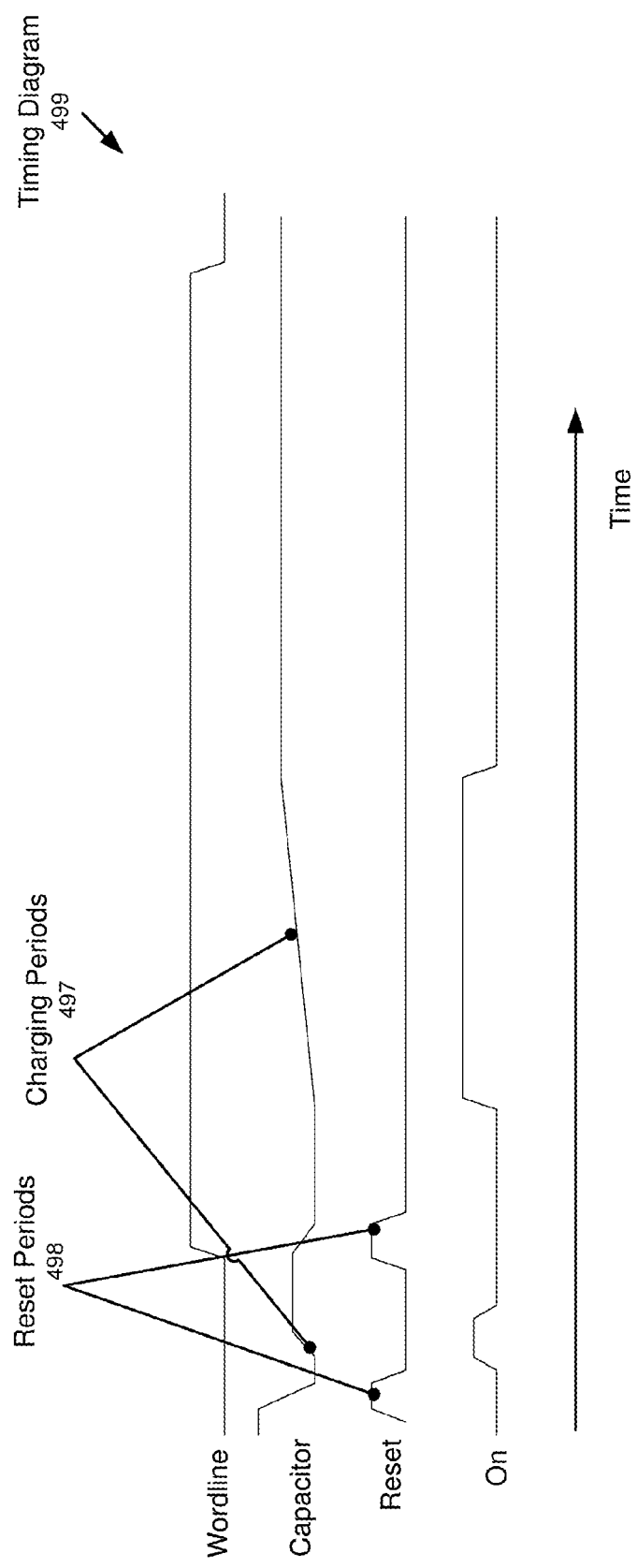
FIG. 4B shows a timing diagram in accordance with one or more embodiments.

FIG. 4B shows a timing diagram (499) in accordance with one or more embodiments. Specifically, the timing diagram (499) shows calibration being executed before each display line update period of a display frame. As shown in FIG. 4B, two reset (498) and two charging periods (497) are used. The first reset period and the first charging period are used for calibration, while the second reset period and the second charging period are for regular use of the DAC. During the calibration, charging is performed for approximately ⅛th of the total time and the resulting test voltage is compared with a target voltage that is approximately ⅛th the full range. If the test voltage is less than the target voltage at the end of the calibration charging, then the current provided by the current source (410) needs to be increased. If the test voltage exceeds the target voltage at the end of the calibration charging, then the current provided by the current source (410) needs to be decreased. In one or more embodiments, the step for the charge pump (465) is a change in current representing about ¼ of a LSB.

Referring back to FIG. 4A, the calibration unit (416) of the DAC (480) has a clocked comparator (460) and a charge pump (465). The clocked comparator (460) generates a pulse on either its out_n or out_p outputs depending on whether the test voltage or the target voltage is greater. In other words, the out_n and out_p outputs are essentially lines used to report the comparison between the test voltage and the target voltage. These lines from the clocked comparator (460) drive the charge pump (465) to inject, depending on whether the test voltage or the target voltage is greater, a timed positive current or negative current using the current source (410).

As discussed above, the current source may be composed of multiple mirrored currents having different amperages. In such embodiments, different mirrored currents may be calibrated using different techniques. For example, a large mirrored current may be calibrated, using a successive approximation technique, to be just below the total desired current to be provided by the current source. A smaller mirrored current may be controlled by a charge pump and used to make up the difference between the large current and the desired current.

Those skilled in the art, having the benefit of this detailed description, will appreciate that additional calibration may be provided by adding the non-linear behavior to the gamma table (identical across all channels) and/or multiplying each channel by a calibration value to account for capacitor/current source mismatch.

In many of the embodiments disclosed, the voltage source (e.g., voltage source A (112A)) of the DAC (e.g., DAC A (180A)) is reset to ground before it is charged. FIGS. 5A-5D show a DAC (505) in which the capacitor (i.e., CFB) of the voltage source is not reset to ground, but rather to a reference voltage (Vmid), and discharged towards ground. The capacitor CFB is then placed across an amplifier (510) to produce the output (i.e., applied voltage of the voltage source).

Figure 5A:
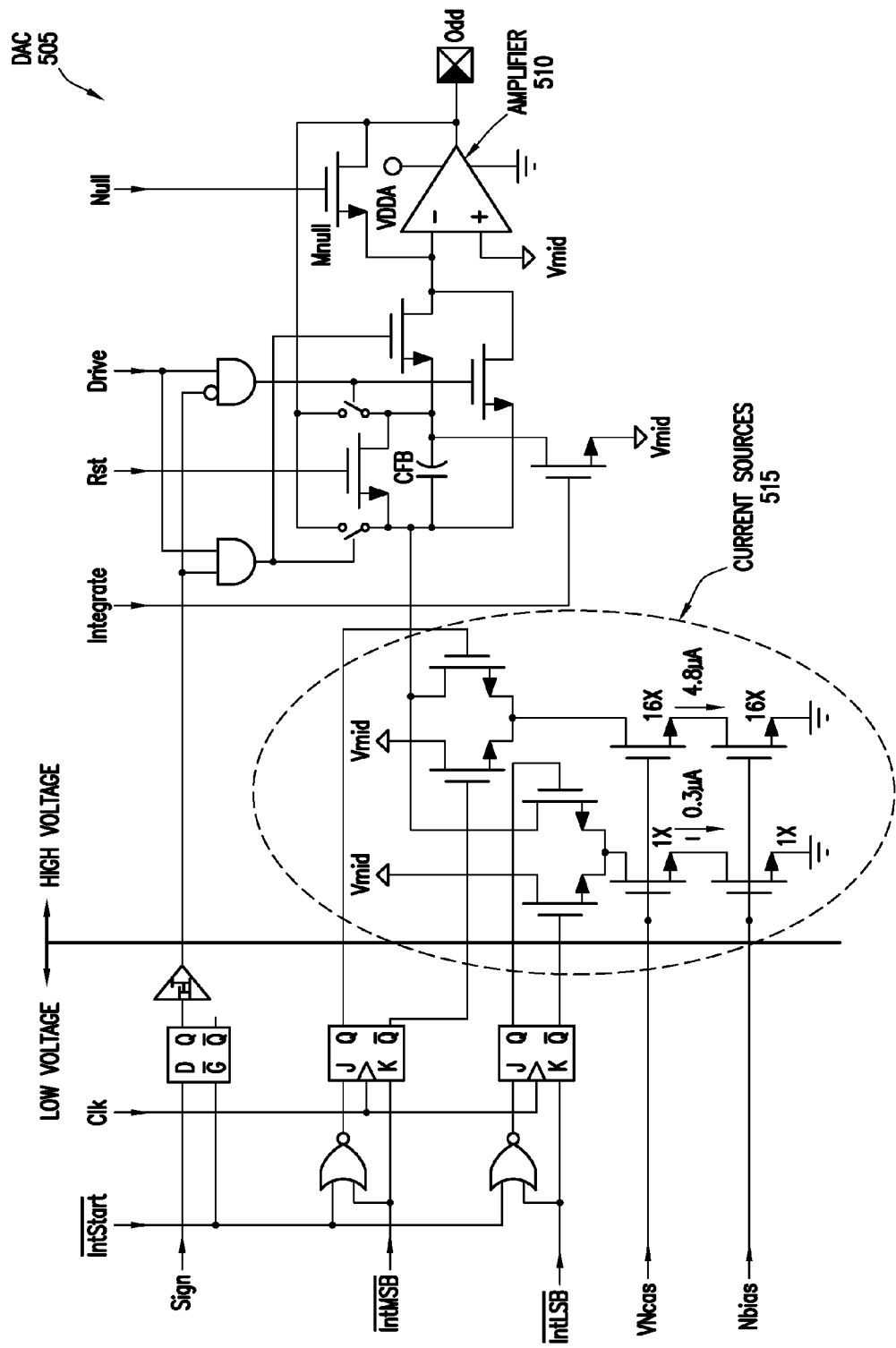
FIG. 5A-5D show a DAC in accordance with one or more embodiments.
Figure 5B:
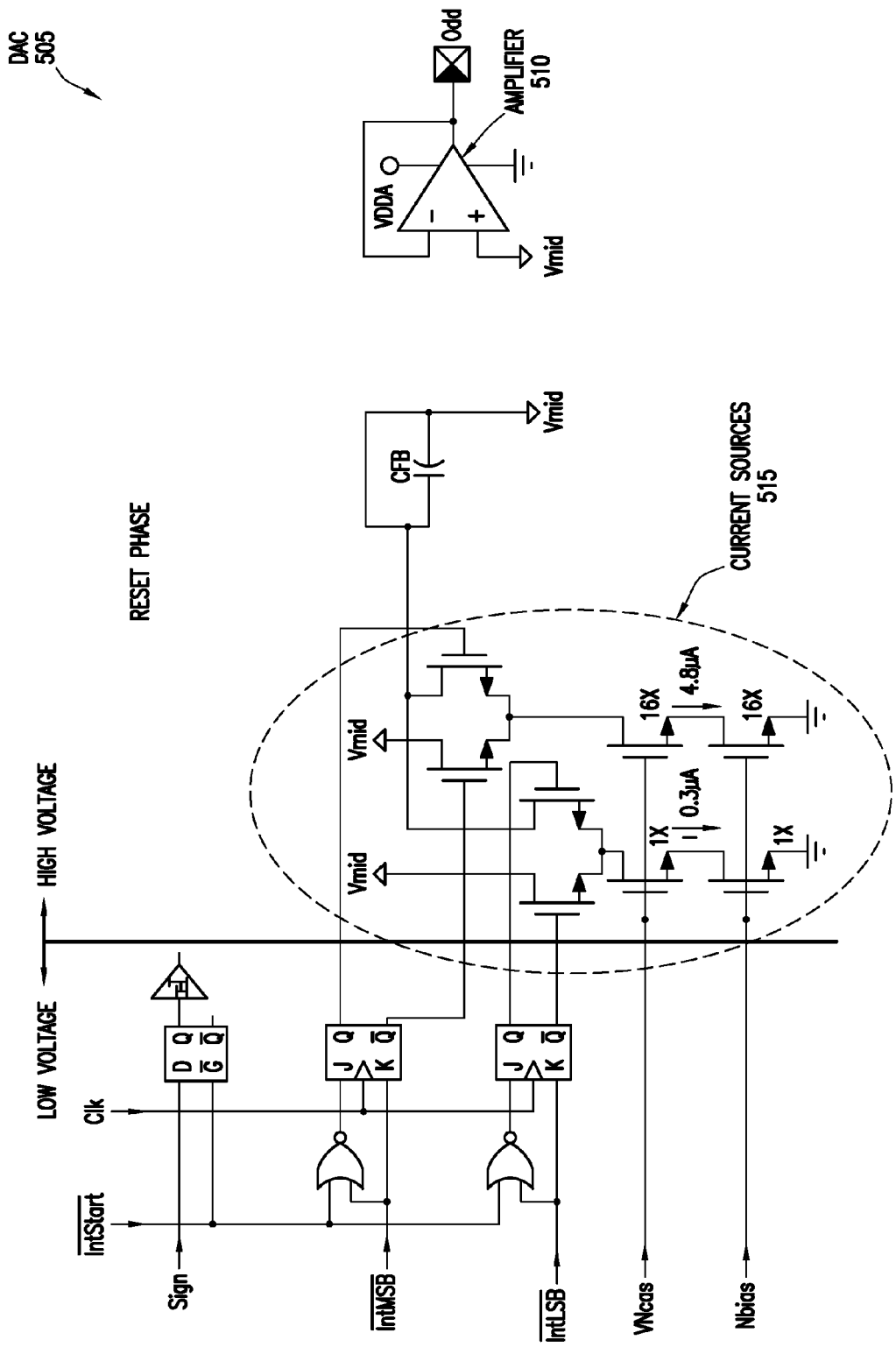
Figure 5C:
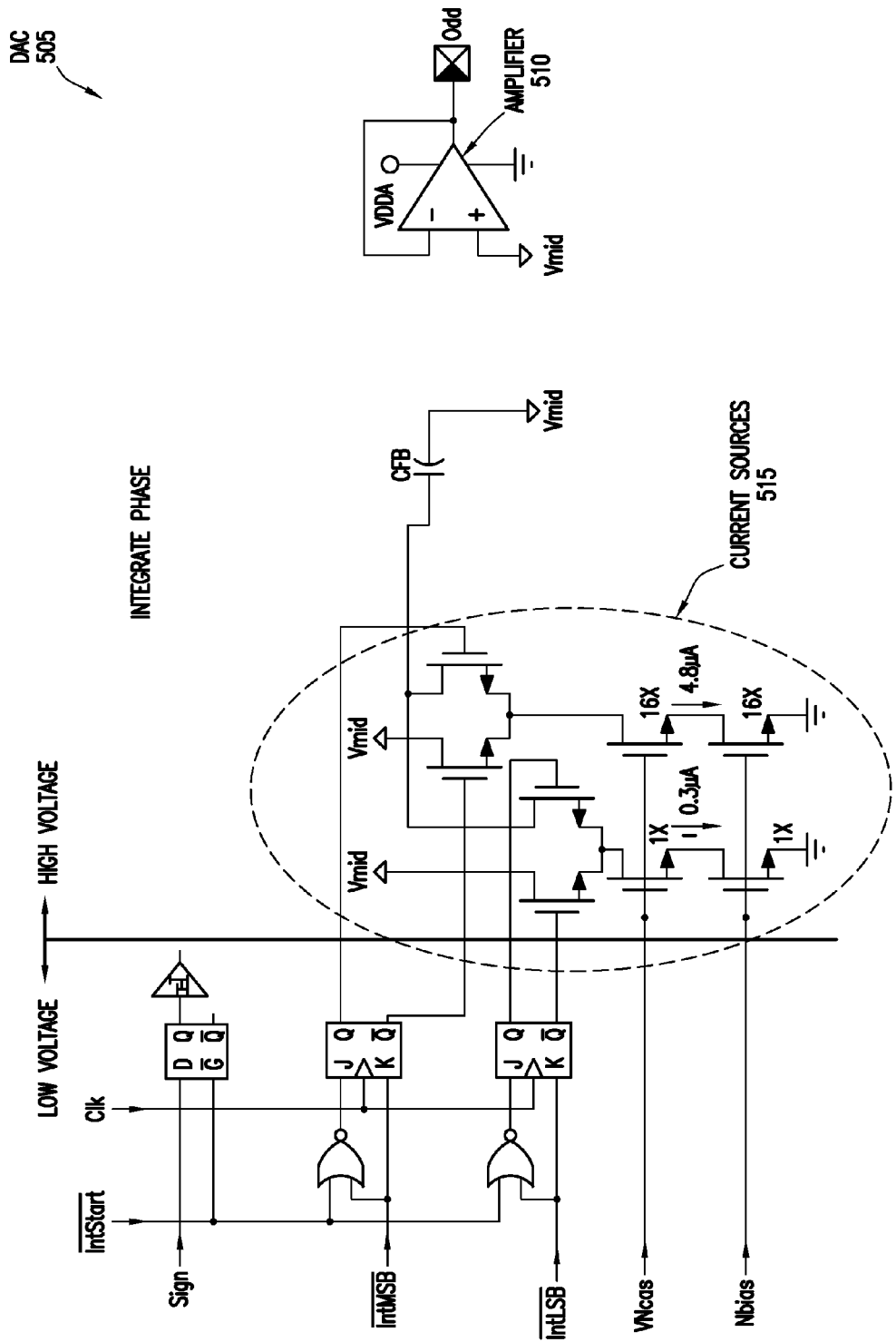
Figure 5D:
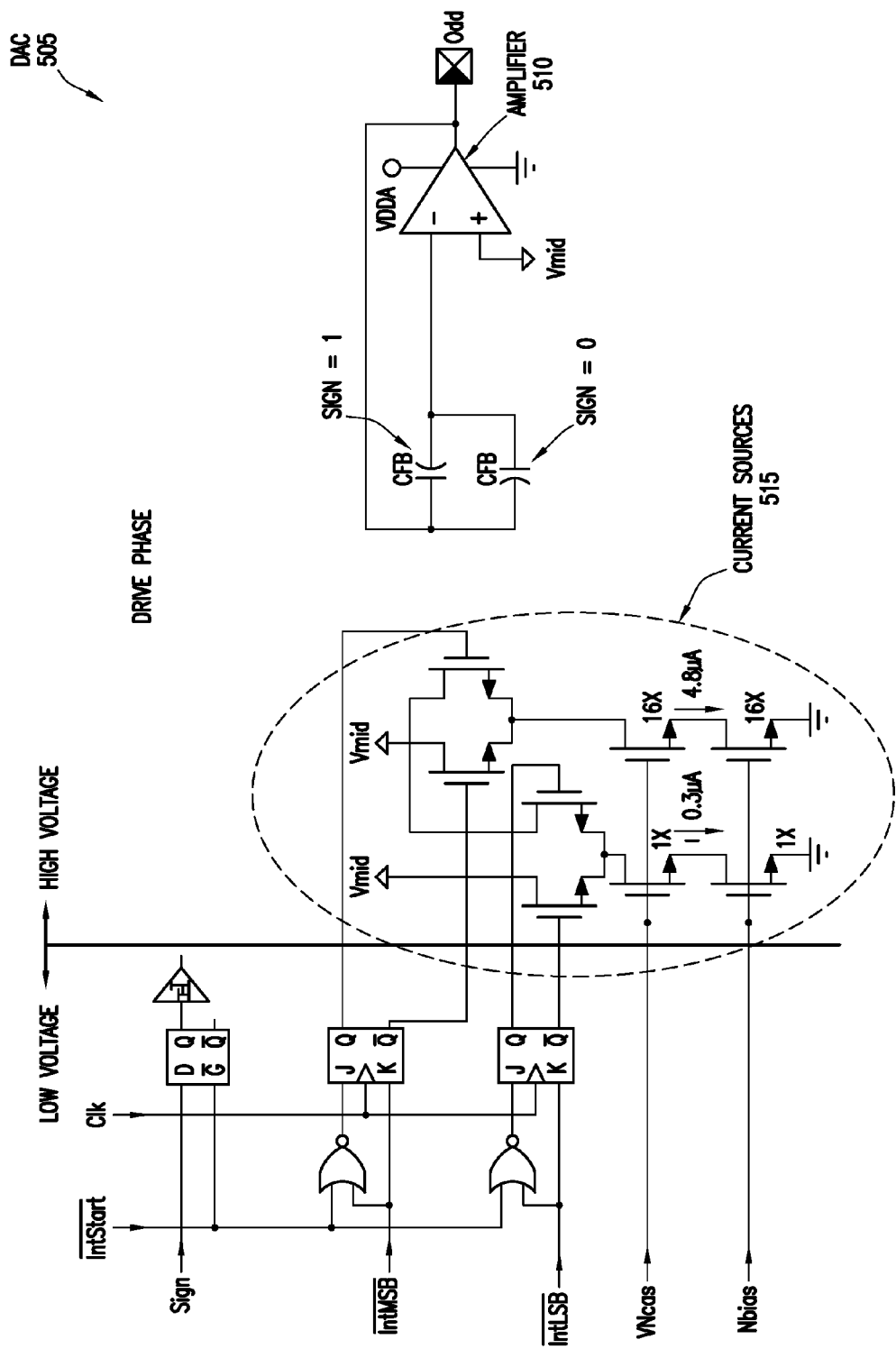

The DAC (505) has three phases for producing an analog voltage output based on an input digital input: a Reset phase (FIG. 5B), an Integrate (i.e., charging) phase (FIG. 5C), and a Drive phase (FIG. 5D).

In the Reset phase (FIG. 5B), the amplifier (510) is in a unity gain configuration and CFB is shorted. In this configuration, the current from the current sources (515) is shunted to Vmid.

In the Integrate or Charge phase (FIG. 5C), the amplifier (510) remains in unity gain. The current source (515) switches and CFB linearly ramps down. This integration (i.e., charging) is halted after a time determined by the digital code. There are two currents one for the LSBs and one for the MSBs. The integration (i.e., charging) times of the two are independent.

In the Drive phase (FIG. 5D), the CFB is disconnected from the current sources (515) and connected between the amplifier's (510) inverting input and its output (the shorting switch is opened). The direction CFB is placed across the amplifier is determined by the Sign bit. The final output (i.e., the voltage applied by the voltage source) is Vmid±VCFB.

Figure 5E:
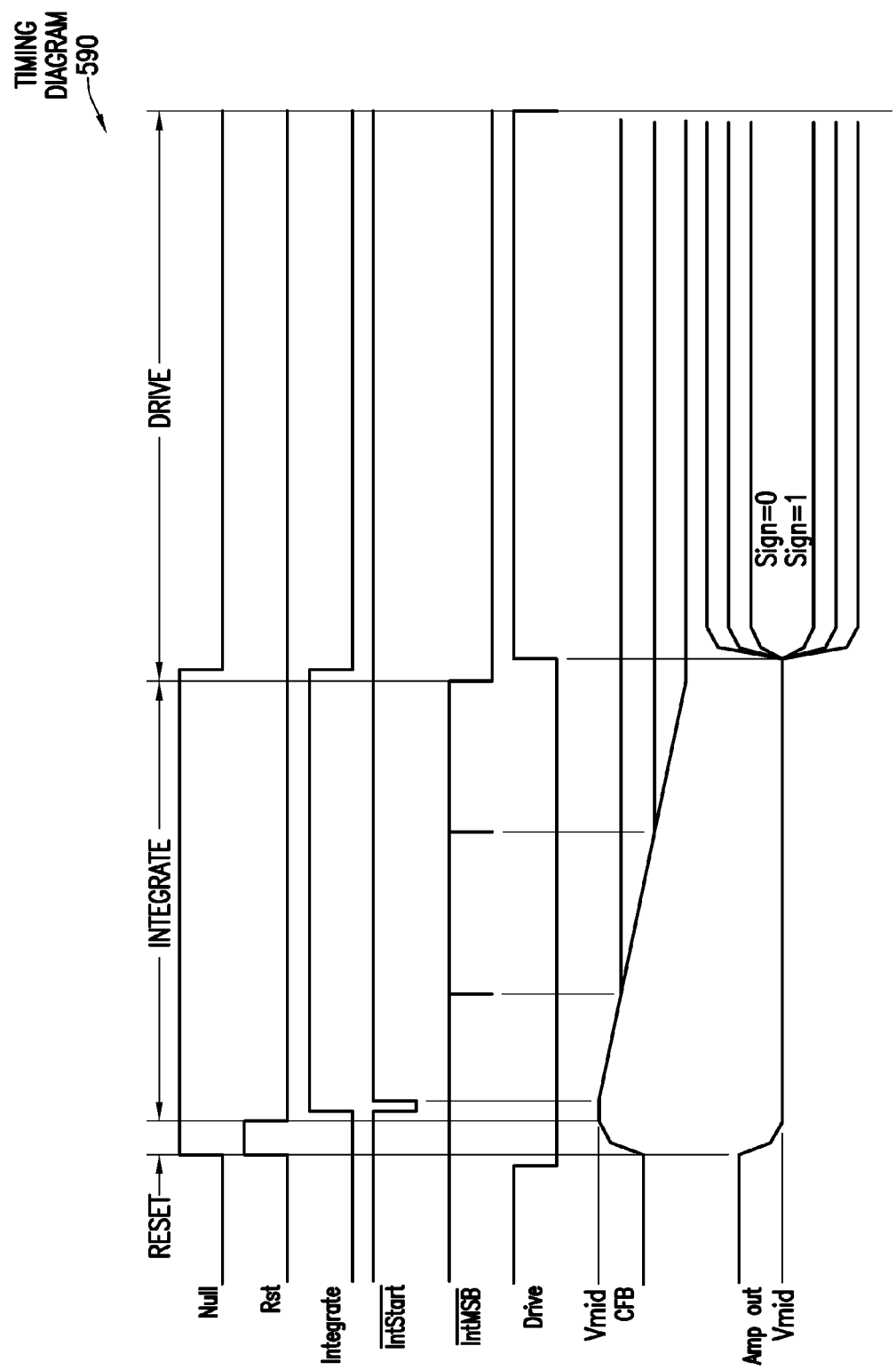
FIG. 5E shows a timing diagram in accordance with one or more embodiments.

FIG. 5E shows a timing diagram (590) for the DAC (505) during the three phases.

Those skilled in the art, having the benefit of this detailed description, will appreciate that by using the DAC (505), the absolute error is reduced or event minimized in the center of the range. Specifically, an LCD's response to voltage is nonlinear, and the response is most sensitive in the center.

Those skilled in the art, having the benefit of this detailed description, will appreciate that by holding the amplifier's (510) positive input at Vmid, the need for a rail-to-rail input is eliminated, resulting in a simpler, smaller, and lower power amplifier.

Those skilled in the art, having the benefit of this detailed description, will appreciate that by using two digital signals to control two differential pairs, these signals do not need to be level shifted from the low voltage digital domain to the high voltage analog domain. Further, in the DAC (505) the required precision of the integration (i.e., charging) operation is reduced by a factor of 2.

FIG. 6 shows a bias generator (605) in accordance with one or more embodiments of the invention. The bias generator (605) may be used with the DAC (505) discussed above in reference to FIGS. 5A-5E. The result of using the bias generator (605) is a more accurate current and the DAC (505) is less dependent on the clock period. In other words, there will no impact, or only a small impact, on the DAC output if the clock period varies.

The bias generator (505) charges CREF to Vmid and then connects it to the amplifier input. The amplifier's feedback will force CREF back to VMID. Each clock cycle will therefore transfer charge: $Q_N = V_{MID} V_{REF}$. The current will be:

$$I_{AVG} = \frac{V_{MID} C_{REF} f_{Clk}}{32}$$

The factor of 32 is due to dividing fCLK by 32. Using this current for the DAC (505) and integrating for M clock cycles for the MSBs and L clock cycles for the LSBs produces a voltage on CFB of:

$$V_{C_{FB}} = \frac{I_{AVG}}{C_{FB}} T_{Clk} \left( M + \frac{L}{16} \right) = \frac{V_{MID} C_{REF}}{C_{FB}} \left( \frac{M}{32} + \frac{L}{512} \right),$$

-continued $$0 \le M \le 31, 0 \le L \le 15$$

Here, voltage applied by the voltage source (i.e., the output of the DAC (505)) is dependent only on the ratio of the capacitors and VMID. VMID is a bandgap based Voltage and is stable over temperature and process. The matching of each CFB to the global CREF should be within ±2%. Current and device mismatch are compensated through calibration. In one or more embodiment, this method is suitable for slow variations of the clock frequency over 10 μs.

Figure 7:
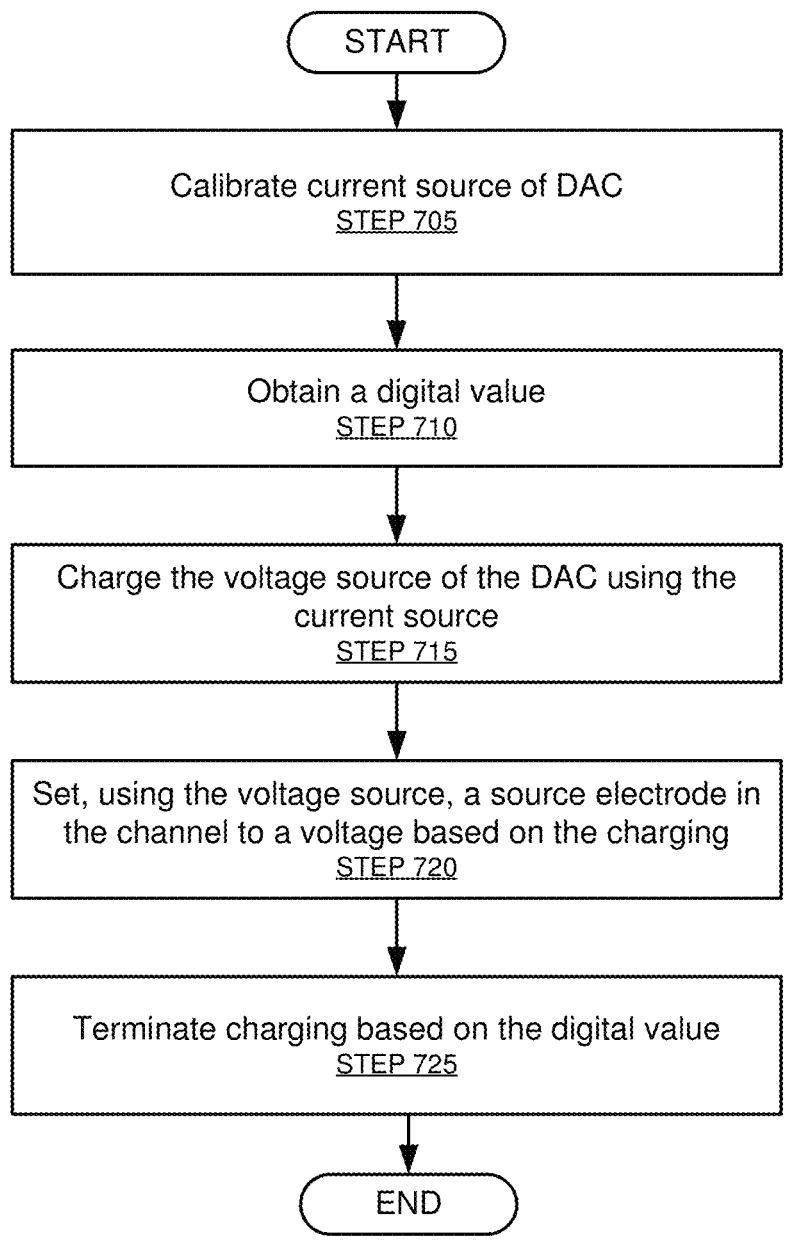
FIG. 7 and FIG. 8 show flowcharts in accordance with one or more embodiments.

FIG. 7 shows a flowchart in accordance with one or more embodiments of the invention. The flowchart depicts a process for operating a source driver for a display. The source driver includes multiple channels with each channel having a DAC connected to a source electrode. Each DAC inputs a digital value and applies a corresponding analog voltage to the source electrode. One or more of the steps in FIG. 7 may be performed by the components of the source driver (100), discussed above in reference to FIG. 1. In one or more embodiments of the invention, one or more of the steps shown in FIG. 7 may be omitted, repeated, and/or performed in a different order than the order shown in FIG. 7. Accordingly, the scope of the invention should not be considered limited to the specific arrangement of steps shown in FIG. 7.

Initially, the current source of the DAC is calibrated (STEP 705). This calibration is further explained in FIG. 8. The current source provides an approximately constant current. The current source may have multiple mirrored currents with no two mirrored currents being of the same amperage. In other words, the approximately constant current may be the sum of multiple mirrored currents. The current source may be shared with multiple DACs.

In STEP 710, a digital value is obtained. The digital value may be of any size. For example, the digital value may be 13 bits in size. The digital value may be partitioned into a set of LSBs and a set of MSBs.

In STEP 715, the voltage source of the DAC is charged using the current source. In other words, the approximately constant current provided by the current source is used to charge the voltage source. The voltage source may be a capacitor in which the voltage is effectively an integration of the charging current. Continuous or repeated charging increases (e.g., ramps) the voltage of the voltage source.

In STEP 720, voltage of the voltage source is applied to a source electrode. The magnitude of the voltage is a function of the duration of the charging, the amperage of the current provided by the current source, and the properties (e.g., capacitance) of the voltage source (e.g., capacitor).

In STEP 725, charging of the voltage source is terminated based on the digital value. For example, the digital value may be loaded into a counter and the counter is decremented each clock cycle. When the counter reaches zero, the charging is terminated (discussed above in reference to FIG. 1).

As another example, the digital value may be loaded into a latch and compared with an incrementing count. When the count equals the digital value, the charging is terminated (discussed above in reference to FIG. 4A).

As yet another example, the digital value may be used to select various binary pulses of a reduced edge clock (REC) signal (discussed above in reference to FIG. 3). Charging occurs during the selected pulses of the REC and is terminated for the non-selected pulses of the REC.

In all of the mentioned cases, as the voltage applied by the voltage source is a function of the charging duration, and as the charging duration is a function of the digital value, the voltage applied by the voltage source is a function of the digital value. A larger digital value may result in a longer charging duration and thus a larger voltage being applied by the voltage source to the source electrode.

Figure 8:
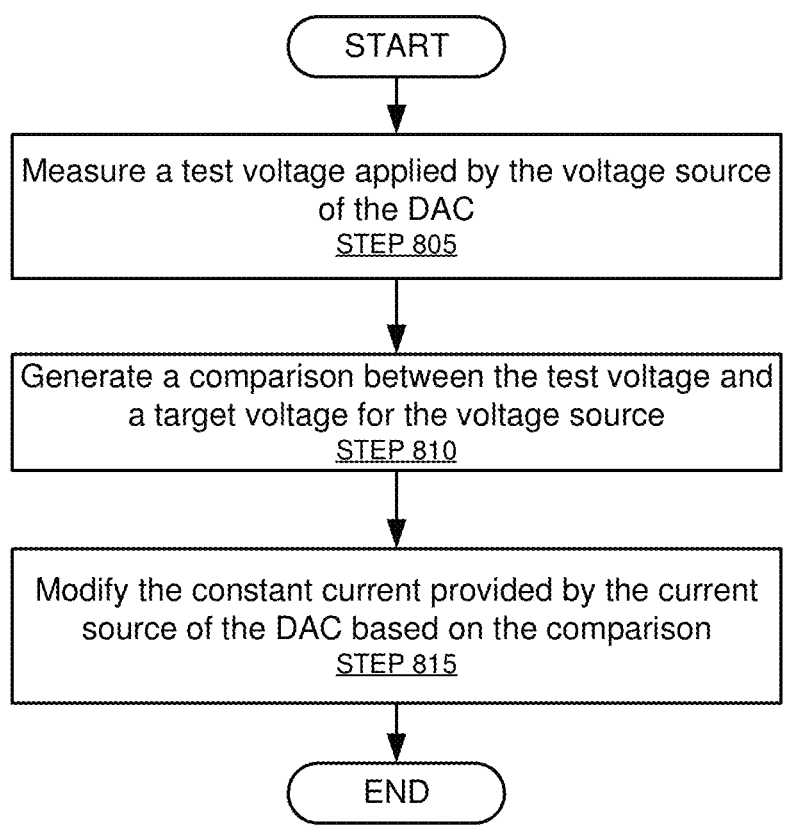

FIG. 8 shows a flowchart in accordance with one or more embodiments of the invention. The flowchart depicts a process for operating a source driver for a display. The source driver includes multiple channels with each channel having a DAC. Each DAC may have a current source requiring calibration. One or more of the steps in FIG. 8 may be performed by the calibration units (116A, 116B, 116C) discussed above in reference to FIG. 1. In one or more embodiments of the invention, one or more of the steps shown in FIG. 8 may be omitted, repeated, and/or performed in a different order than the order shown in FIG. 8. Accordingly, the scope of the invention should not be considered limited to the specific arrangement of steps shown in FIG. 8. In one or more embodiments of the invention, the process depicted in FIG. 8 is an expansion of STEP 705, discussed above in reference to FIG. 7.

Initially, a test voltage applied by the voltage source of the DAC is measured (STEP 805). This may include first resetting and then charging the voltage source (e.g., capacitor) with an approximately constant current provided by the current source of the DAC. The duration of the charging may be a fraction (e.g., ⅛) of the standard (i.e., non-calibration) charging time. The calibration process may be initiated at any time. For example, calibration may be executed before each display line update period of a display frame. As another example, the calibration process may be executed during vertical blanking periods. As yet another example, the calibration process may be executed during non-display update periods that occur between display line update periods of a display frame.

In STEP 810, a comparison is generated between the test voltage and a target voltage for the voltage source. The target voltage source may be a fraction (e.g., ⅛) of the standard (i.e., non-calibration) voltage. The comparison may be executed by a clocked comparator. The clocked comparator may output a pulse on different lines depending on whether the target voltage is higher or the test voltage is higher.

In STEP 815, the constant current provided by the current source is modified based on the comparison. Specifically, if the test voltage is less than the target voltage, the current provided by the current source is increased. If the test voltage is larger than the target voltage, the current provided by the current source is decreased.

As discussed above, in embodiments where the current source has multiple mirrored currents, different calibration techniques may be applied to the different mirrored currents.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A source driver for a display, comprising:
a current source configured to provide an approximately constant current and comprising:
a first transistor comprising a first gate, a first drain, and a first source; and a second transistor comprising a second gate, a second drain connected to the first source, and a second source;
a channel coupled to a source electrode and comprising a digital to analog converter (DAC), the DAC comprising:
a voltage source connected to the second source and configured to apply an output voltage to the source electrode based on the approximately constant current provided by the current source; and
a control unit comprising circuitry connected to the first gate and configured to:
input a digital value; and
terminate, based on the digital value, charging of the voltage source by the approximately constant current; and
a calibration unit comprising:
a clocked comparator configured to:
generate a comparison between a test voltage applied by the voltage source and a target voltage;
select, based on the comparison, a first line from a plurality of lines comprising the first line and a second line; and
output a pulse on the first line but not the second line; and
a charge pump connected to the second gate of the second transistor, coupled with the first drain of the first transistor, and comprising a plurality of transistors comprising a plurality of gates connected to the plurality of lines,
wherein the charge pump is configured to modify the approximately constant current based on the pulse.

2. The source driver of claim 1, wherein the approximate constant current source is a sum of at least a first current and a second current, and wherein modifying the approximate constant current source comprises modifying the first current and the second current using different techniques.

3. The source driver of claim 1, wherein the calibration unit modifies the approximately constant current by increasing the approximately constant current in response to the target voltage exceeding the test voltage.

4. The source driver of claim 1, wherein the calibration unit modifies the approximately constant current by decreasing the approximately constant current.

5. The source driver of claim 1, wherein the calibration unit modifies the approximately constant current before each display line update period of a display frame.

6. The source driver of claim 1, wherein the calibration unit modifies the approximately constant current during vertical blanking periods.

7. The source driver of claim 1, wherein the calibration unit modifies the approximately constant current during non-display update periods that occur between display line update periods of a display frame.

8. A method for operating a source driver for a display, comprising:
obtaining, by a digital to analog converter (DAC) in a channel of the source driver, a digital value;
charging, using a current source that provides an approximately constant current, a voltage source of the DAC, wherein the current source comprises:
a first transistor comprising a first gate, a first drain, and a first source; and
a second transistor comprising a second gate, a second drain connected to the first source, and a second source connected to the voltage source;
setting, using the voltage source of the DAC, a source electrode of the channel to an output voltage based on the charging;
terminating, by a control unit connected to the first gate, charging of the voltage source based on the digital value;
generating, by a clocked comparator of a calibration unit, a comparison of a test voltage applied by the voltage source with a target voltage;
selecting, by the clocked comparator and based on the comparison, a first line of a plurality of lines comprising the first line and a second line;
outputting a pulse on the first line but not the second line; and
modifying, by a charge pump of the calibration unit connected to the second gate and coupled with the first drain, the approximately constant current based on the pulse, wherein the charge pump comprises a plurality of transistors comprising a plurality of gates connected to the plurality of lines.

9. The method of claim 8, wherein the approximately constant current is a sum of at least a first current and a second current, and wherein modifying the approximately constant current comprises modifying the first current and the second current using different techniques.

10. The method of claim 8, wherein modifying the approximately constant current comprises increasing the approximately constant current in response to the target voltage exceeding the test voltage.

11. The method of claim 8, wherein the approximately constant current is modified before each display line update period of a display frame.

12. The method of claim 8, wherein the approximately constant current is modified during vertical blanking periods.

13. The method of claim 8, wherein the approximately constant current is modified during non-display update periods that occur between display line update periods of a display frame.

14. A digital to analog converter (DAC), comprising:
a current source configured to provide an approximately constant current and comprising:
a first transistor comprising a first gate, a first drain, and a first source; and
a second transistor comprising a second gate, a second source, and a second drain connected to the first source;
a voltage source connected to the second source and configured to output a voltage based on the approximately constant current provided by the current source;
a control unit comprising circuitry connected to the first gate and configured to:
input a digital value; and
terminate, based on the digital value, charging of the voltage source by the approximately constant current; and
a calibration unit comprising:
a clocked comparator configured to:
generate a comparison between a test voltage applied by the voltage source and a target voltage;
select, based on the comparison, a first line from a plurality of lines comprising the first line and a second line; and
output a pulse on the first line but not the second line; and
a charge pump connected to the second gate of the second transistor, coupled with the first drain of the first transistor, and comprising a plurality of transistors comprising a plurality of gates connected to the plurality of lines,
wherein the charge pump is configured to modify the approximately constant current based on the pulse.

15. The DAC of claim 14, wherein the approximately constant current is a sum of at least a first current and a second current, and wherein the calibration unit modifies the approximately constant current by modifying the first current and the second current using different techniques.

16. The DAC of claim 14, wherein the calibration unit modifies the approximately constant current by increasing the approximately constant current in response to the target voltage exceeding the test voltage.

* * * * *